(12) United States Patent
Zhou

(10) Patent No.: US 11,190,150 B2
(45) Date of Patent: Nov. 30, 2021

(54) CMOS TRIPLE-BAND RF VGA AND POWER AMPLIFIER IN LINEAR TRANSMITTER

(75) Inventor: Lin Zhou, Chapel Hill, NC (US)

(73) Assignee: HUWOMOBILITY, INC., Milpitas, CA (US)

( * ) Notice: Subject to any disclaimer, the term of this patent is extended or adjusted under 35 U.S.C. 154(b) by 0 days.

(21) Appl. No.: 11/736,450

(22) Filed: Apr. 17, 2007

(65) Prior Publication Data

US 2008/0258821 A1    Oct. 23, 2008

(51) Int. Cl.

| | |
|---|---|
| *H03F 3/04* | (2006.01) |
| *H03F 3/24* | (2006.01) |
| *H03F 1/22* | (2006.01) |
| *H03F 3/193* | (2006.01) |
| *H03G 1/00* | (2006.01) |
| *H03F 1/56* | (2006.01) |

(52) U.S. Cl.
CPC ............... *H03F 3/193* (2013.01); *H03F 1/22* (2013.01); *H03F 1/56* (2013.01); *H03G 1/0029* (2013.01)

(58) Field of Classification Search
CPC .. H03F 3/193; H03F 1/22; H03F 1/56; H03G 1/0029
USPC ...................... 330/133, 126, 147, 148
See application file for complete search history.

(56) References Cited

U.S. PATENT DOCUMENTS

| | | | | |
|---|---|---|---|---|
| 7,460,615 | B2 * | 12/2008 | Kunysz | ............... G01S 19/32 342/352 |
| 9,319,005 | B2 * | 4/2016 | Scott | ............... H03F 3/211 |
| 2009/0180403 | A1 * | 7/2009 | Tudosoiu | ............ H04B 1/0483 370/278 |

* cited by examiner

*Primary Examiner* — Hieu P Nguyen

(57) ABSTRACT

Methods and systems for amplifying signals are provided. Embodiments include a three-to-one multiplexer, a multi-band RF variable gain amplifier (VGA), a multiband power amplifier driver (PAD), and a one-to three multiplexer. The three-to-one multiplexer receives three input signals from an RF frequency source and outputs an output signal corresponding one input signal. The multiband RF VGA receives the output signal of the three-to-one multiplexer, provides a first level of amplification to the signal received from the three-to-one multiplexer, and outputs an amplified version of the signal. The multiband PAD receives the signal output by the multiband RF variable gain amplifier and provides a second level of amplification to the signal and outputs an amplified version of the signal. The one-to-three multiplexer receives a signal output by the multiband PAD produces three output signals that correspond to each of the three input signals.

35 Claims, 5 Drawing Sheets

Architecture of Multi-Band VGA and PAD in Transmitter

Architecture of Multi-Band VGA and PAD in Transmitter

Core Switch in MUX 3-1

Core Switch in MUX 1-3

CMOS TRIPLE-BAND RF VGA AND POWER AMPLIFIER IN LINEAR TRANSMITTER

BACKGROUND OF THE INVENTION

The present invention relates generally to wireless communications and in particular to multiband radio-frequency amplifiers.

Wireless data communications have become increasingly prevalent as previously wired networks are replaced by wireless systems. Wireless networking technologies have been integrated into numerous products for the home and office. As these technologies evolve, existing wireless communications standards evolve and new standards are created to meet the demands of new communications technologies. As a result, wireless networks may include devices configured to communicate using different wireless communications protocols and/or using different frequency bands. For example, a wireless network might include devices using the IEEE 802.11a protocol, which operates at the 5 GHz frequency band, and devices using the IEEE 802.11b/g protocols, which operate at the 2.4 GHz frequency band. Furthermore, each frequency band may be subdivided into multiple channels and over which wireless devices may be sending and/or receiving data. For example, 2.4 GHz band of the IEEE 802.11 b/g protocols contains eleven separate channels spaced 5 MHz apart. Of the eleven separate channels, channels CH1 (2412 MHz) 710, CH6 (2437 MHz) 720, and CH11 (2642 MHz) 730 are most extensively used for wireless communications, because these the most widely spaced channels within the 2.4 GHz frequency band and provide non-overlapping channels.

As a result, there is a demand for transmitters that can be configured to transmit on multiple frequencies bands in order to operate with devices using different frequency and/or devices communicating on different channels within a frequency band. Current multiband transmitter RF transmitters however are often comprised of multiple single-band transmitters integrated into a single device. As a result, the current multiband transmitters may have large device footprints and can be expensive to manufacture, because these transmitters have large chips sets since each frequency band is processed by a separate single-band transmitters each comprising separate circuits. Furthermore, many of the components of each single-band transmitter are virtually identical resulting in duplicated circuitry that could be used when transmitting on different frequency bands. For example, each of the individual single-band transmitters may include amplification circuits that are virtually identical.

According, wireless multiband transmitters configured to use a single configurable set of amplifier logic for transmitting on multiple frequency bands are desired.

BRIEF SUMMARY OF THE INVENTION

The present invention advantageously addresses the problems of the current multiband amplifier systems for wireless communications by providing systems and methods for operating a triple-band RF variable gain amplifier and power amplifier in a linear transmitter.

Embodiments of the present invention advantageously use a single set of amplifiers configured to amplify prior to transmission a wireless signal on one of a plurality of frequencies. Embodiments provide wireless transmitters with smaller footprint than current systems by decreasing the size of the chip set used to implement the transmitter. As a result, the form factor of wireless devices using the present invention may be smaller than current device and manufacturing costs may also be decreased as the number of circuits required to implement a multiband transmitter are decreased. Embodiments of the present invention also include an improved switch design that provides for lower current leakage and for good isolation.

According to an embodiment, an apparatus for amplifying signals is provided. The apparatus includes a three-to-one multiplexer, a multiband radio frequency (RF) variable gain amplifier, a multiband power amplifier driver (PAD), and a one-to three multiplexer. The three-to-one multiplexer is configured to receive three input signals from an RF frequency source and to output an output signal corresponding to one of the three input signals. The multiband RF variable gain amplifier includes a first amplifier input configured to receive the output signal of the three-to-one multiplexer. The multiband RF variable gain amplifier is configured to provide a first level of amplification to a first input signal received via the first amplifier input and to output an amplified version of the first input signal via a first amplifier output. The multiband PAD includes a second amplifier input configured to receive a signal output by the multiband RF variable gain amplifier. The multiband PAD is configured to provide a second level of amplification to a second input signal received via the second amplifier input and to output an amplified version of the second input signal via a second amplifier output. The one-to-three multiplexer configured to receive a signal output by the multiband PAD and to produce three output signals, the three output signals corresponding to each of the three input signals.

According to another embodiment, a method for amplifying signals is provided. The method includes the steps of operating a three-to-one multiplexer, operating a multiband RF variable gain amplifier, operating a multiband power amplifier driver (PAD), and operating a one-to three multiplexer. The three-to-one multiplexer is configured to receive three input signals from an RF frequency source and to output an output signal corresponding to one of the three input signals. The multiband RF variable gain amplifier includes a first amplifier input configured to receive the output signal of the three-to-one multiplexer. The multiband RF variable gain amplifier is configured to provide a first level of amplification to a first input signal received via the first amplifier input and to output an amplified version of the first input signal via a first amplifier output. The multiband PAD includes a second amplifier input configured to receive a signal output by the multiband RF variable gain amplifier. The multiband PAD is configured to provide a second level of amplification to a second input signal received via the second amplifier input and to output an amplified version of the second input signal via a second amplifier output. The one-to-three multiplexer configured to receive a signal output by the multiband PAD and to produce three output signals, the three output signals corresponding to each of the three input signals.

Other features and advantages of the invention will be apparent in view of the following detailed description and preferred embodiments.

BRIEF DESCRIPTION OF THE DRAWINGS

Embodiments of the invention are described here, with reference to the figures. Where elements of the figures are called out with reference numbers, it should be understood that like reference numbers refer to like elements and might or might not be the same instance of the element.

DETAILED DESCRIPTION OF THE INVENTION

The present invention provides a triple-band radio frequency variable gain amplifier (VGA) and multiband power amplifier driver (PAD) in a linear transmitter. Embodiments of the present invention provide a flexible approach for supporting wireless communications on multiple frequency bands. Embodiments of the present invention include an improved switch design that works well with RF signals have relatively large frequency swings and provide for lower current leakage and for good isolation. Transmitters according to embodiments of the present invention also provide a smaller device footprint and power requirements than would be required for a receiver including multiple single-band VGAs and PADs for amplifying signals for each frequency band individually.

Figure 1:
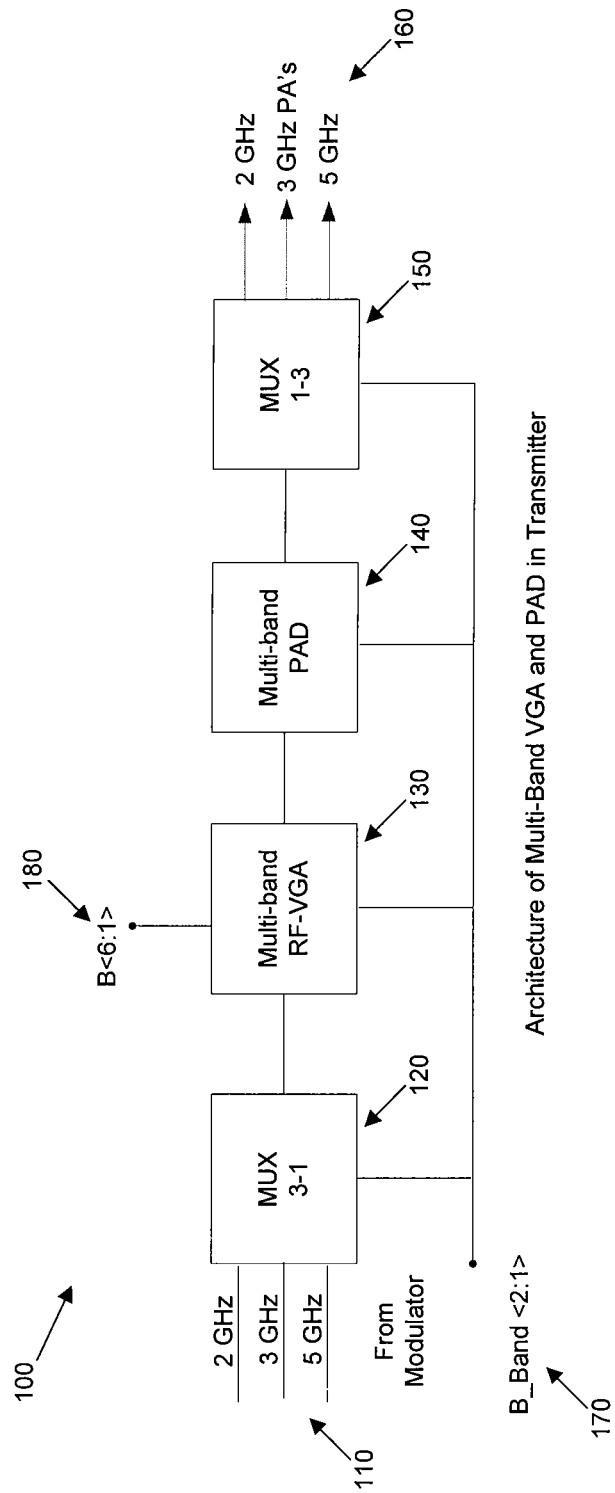
FIG. 1 is a block diagram of a triple-band RF variable gain amplifier and power amplifier driver according to an embodiment.

FIG. 1 is a block diagram of a triple-band RF variable gain amplifier (VGA) and multiband power amplifier driver (PAD) 100 according to an embodiment. System 100 illustrates a triple-band system. However, one skilled in the art will recognize that the systems and methods disclosed here may be applied to systems that are capable of operating on more than three frequency bands.

Triple-band RF VGA and PAD 100 comprises three-to-one multiplexer 120, multiband RF VGA 130, multiband PAD 140, and one-to-three multiplexer 150. Three-to-one multiplexer 120 is configured to receive three input signals 410 from an RF frequency source and to output an output signal corresponding to one of the three input signals. The output from three-to-one multiplexer 120 is input into multiband RF VGA 130. Multiband RF VGA 130 is configured to provide a first level of amplification to the input signal received from three-to-one multiplexer 120. Multiband RF VGA 130 outputs an amplified version of the input signal. The output signal from multiband RF VGA 130 is input into multiband PAD 440. Multiband PAD 440 is configured to provide a second level of amplification to amplified signal output by multiband RF VGA 130. The amplified signal output from multiband PAD 440 is received as an input by one-to-three multiplexer 450. One-to-three multiplexer 450 is configured to take the output signal produced by multiband PAD 440 and to produce three output signals 460 corresponding to input signals 410.

Figure 2:
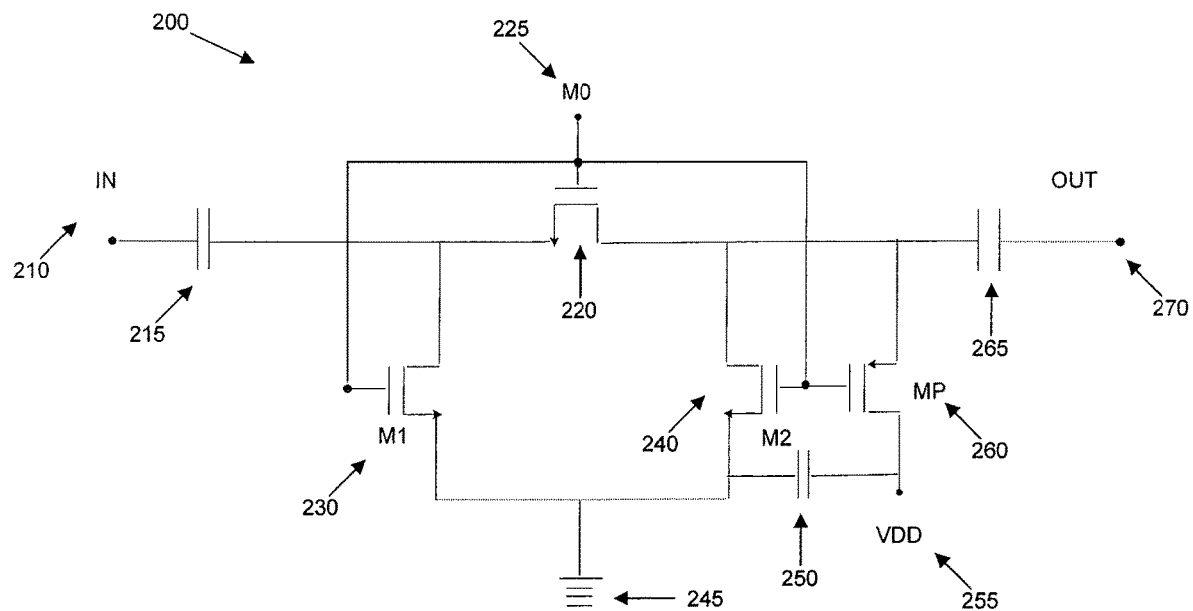
FIG. 2 is circuit diagram of a switch core included in embodiments of three-to-one multiplexer included in embodiments of a triple-band RF VGA and PAD.

FIG. 2 is circuit diagram of a switch core 200 included in embodiments of three-to-one multiplexer 120. Embodiments of three-to-one multiplexer 120 include three switch cores 200. Switch core 200 is configurable to operate in two modes. In the first mode, switch signal input 215 is A/C coupled to switch signal output 270. In the second mode, the switch signal input 215 is disconnected from switch signal output 270. Embodiments of three-to-one multiplexer 120 select one of the three input signals to be output as an output signal by configuring one of the three switch cores to be in the first state and configuring the other two switch core to be in the second state.

Switch core 200 comprises switch signal input 210, first switch capacitor 215, first switch transistor 220, switch control input 225, second switch transistor 230, third switch transistor 240, ground 245, switch voltage supply 255 ($V_{DD}$), fourth switch transistor 260, second switch capacitor 265, third switch capacitor 250, and switch signal output 270.

First switch transistor 220 is coupled to switch control input 225. Switch control input 225 is configurable to a first state associated with a first mode of operation of switch core 200 and is configurable to a second state associated with a second mode of operation of switch core 200. First switch transistor 220 is also coupled to switch signal input 210 via first switch capacitor 215. First switch transistor 220 is also coupled to switch signal output 270 via second switch capacitor 265. First switch transistor 220 provides an A/C coupled path from switch signal input 210 to switch signal output 270 when switch control input 225 is configured to the first state, and first switch transistor 220 disconnects switch signal input 210 from switch signal output 270 when switch control input 225 is configured to the second state.

Second switch transistor 230 is coupled to first switch capacitor 215 and to ground 245. Second switch transistor 230 provides a connection from first switch capacitor 215 to ground 245 when switch control input 225 is configured to the first state, and second switch transistor 230 disconnects first switch capacitor 215 from ground 245 when switch control input 225 is configured to the second state. Therefore, when switch control input 225 is configured to the first state and second switch transistor 230 provides a path from first switch capacitor 215 to ground 245, first switch capacitor 215 is placed in a low impedance state that allows signals to pass from switch signal input 210 to switch signal output 270.

Third switch transistor 240 is coupled to second switch capacitor 265 and to ground 245. Third switch transistor 240 provides a connection from second switch capacitor 265 to ground 245 when switch control input 225 is configured to the first state, and third switch transistor 240 disconnects second switch capacitor 265 from ground 245 when switch control input 225 is configured to the second state. Therefore, when switch control input 225 is configured to the first state and third switch transistor 240 provides a path from second switch capacitor 265 to ground 245, second switch capacitor 265 is placed in a low impedance state that allows signals to pass from switch signal input 210 to switch signal output 270.

Fourth switch transistor 260 is coupled to second switch capacitor 265 and to switch voltage supply 255. Fourth switch transistor 260 provides a connection between second switch capacitor 265 and switch voltage supply 255 when switch control input 225 is configured to the second state. Second switch capacitor 265 is maintained at $V_{DD}$ and switch input signal 210 is disconnected from switch output signal 270 because second switch capacitor 265 is configured to provide high impedance isolation. When switch control input 225 is configured to the first state, fourth switch transistor 260 disconnects second capacitor 265 from switch supply voltage 255, and second switch capacitor 265 is maintained in a low impedance state.

Figure 3:
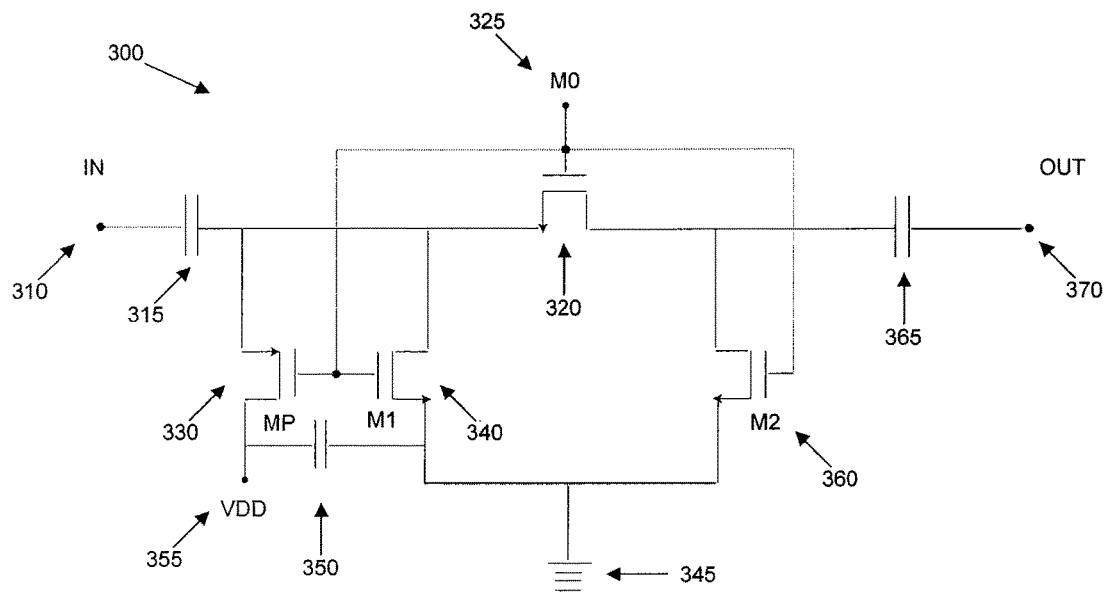
FIG. 3 is circuit diagram of a switch core included in embodiments of a one-to-three multiplexer included in embodiments of a triple-band RF VGA and PAD.

FIG. 3 is circuit diagram of a switch core included in embodiments of one-to-three multiplexer 150. Embodiments of one-to-three multiplexer 150 include three switch cores 300. Switch core 300 is configurable to operate in two modes. In the first mode, switch signal input 315 is A/C coupled to switch signal output 370. In the second mode, the switch signal input 315 is disconnected from switch signal output 370. Embodiments of one-to-three multiplexer 150 select one of three outputs to output an input signal received by one-to-three multiplexer 150 by configuring one of the three switch cores to be in the first state and configuring the other two switch core to be in the second state.

Switch core 300 comprises switch signal input 310, first switch capacitor 315, first switch transistor 320, switch control input 325, second switch transistor 340, third switch transistor 360, ground 345, switch voltage supply 355 ($V_{DD}$), fourth switch transistor 330, second switch capacitor 365, third switch capacitor 350, and switch signal output 370.

First switch transistor 320 is coupled to switch control input 325. Switch control input 325 is configurable to a first state associated with a first mode of operation of switch core 300 and is configurable to a second state associated with a second mode of operation of switch core 300. First switch transistor 320 is also coupled to switch signal input 310 via first switch capacitor 315. First switch transistor 320 is also coupled to switch signal output 370 via second switch capacitor 365. First switch transistor 320 provides an A/C coupled path from switch signal input 310 to switch signal output 370 when switch control input 325 is configured to the first state, and first switch transistor 320 disconnects switch signal input 310 from switch signal output 370 when switch control input 325 is configured to the second state.

Second switch transistor 340 is coupled to first switch capacitor 315 and to ground 345. Second switch transistor 340 provides a connection from first switch capacitor 315 to ground 345 when switch control input 325 is configured to the first state, and second switch transistor 340 disconnects first switch capacitor 315 from ground 345 when switch control input 325 is configured to the second state. Therefore, when switch control input 325 is configured to the first state and second switch transistor 340 provides a path from first switch capacitor 315 to ground 345, first switch capacitor 315 is placed in a low impedance state that allows signals to pass from switch signal input 310 to switch signal output 370.

Third switch transistor 360 is coupled to second switch capacitor 365 and to ground 345. Third switch transistor 360 provides a connection from second switch capacitor 365 to ground 345 when switch control input 325 is configured to the first state, and third switch transistor 360 disconnects second switch capacitor 365 from ground 345 when switch control input 325 is configured to the second state. Therefore, when switch control input 325 is configured to the first state and third switch transistor 360 provides a path from second switch capacitor 365 to ground 345, second switch capacitor 365 is placed in a low impedance state that allows signals to pass from switch signal input 310 to switch signal output 370.

Fourth switch transistor 330 is coupled to second switch capacitor 365 and to switch voltage supply 355. Fourth switch transistor 330 provides a connection between second switch capacitor 365 and switch voltage supply 355 when switch control input 325 is configured to the second state. Second switch capacitor 365 is maintained at $V_{DD}$ and switch input signal 310 is disconnected from switch output signal 370 because second switch capacitor 365 is configured to provide high impedance isolation. When switch control input 325 is configured to the first state, fourth switch transistor 330 disconnects second capacitor 365 from switch supply voltage 355, and second switch capacitor 365 is maintained in a low impedance state.

Figure 4:
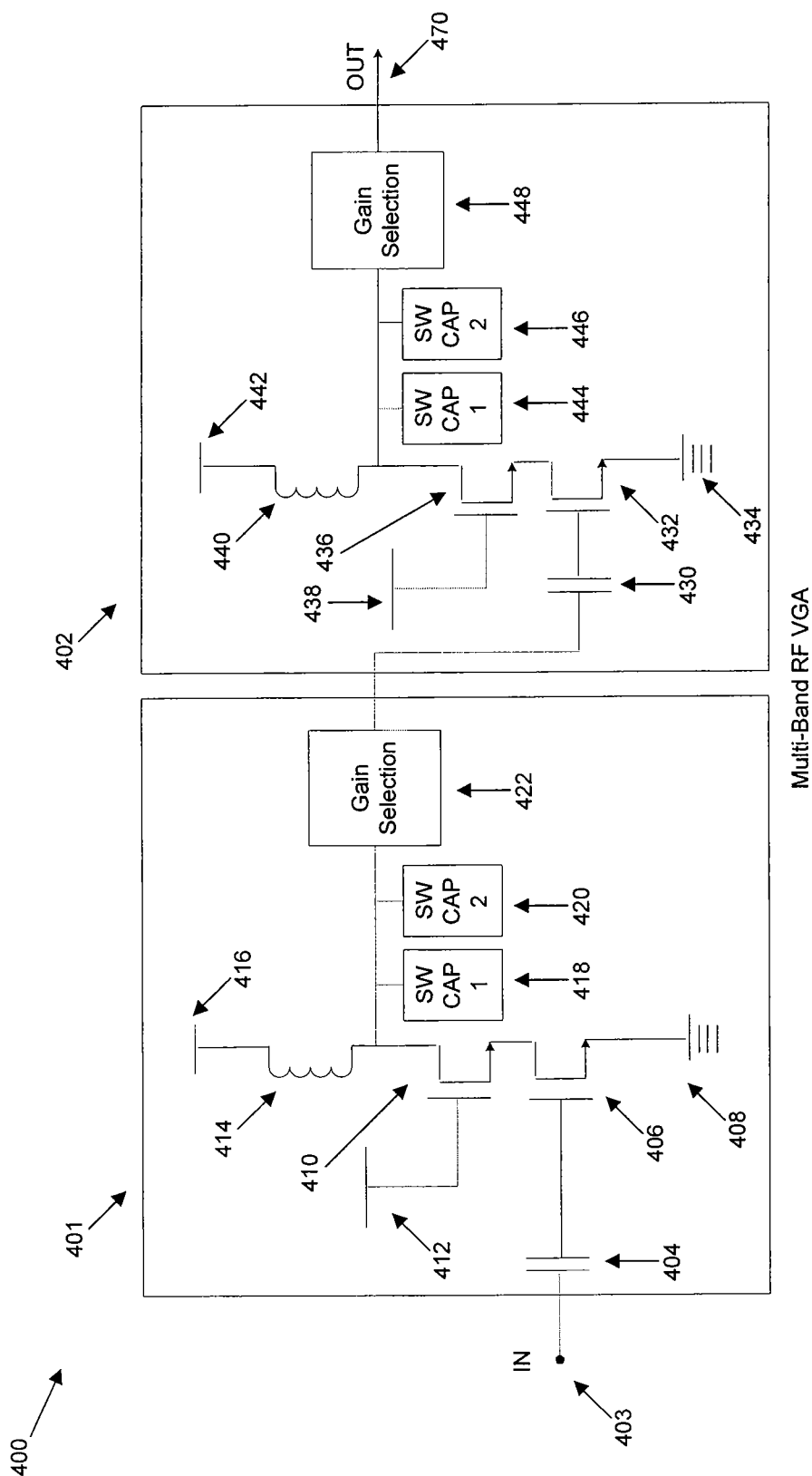
FIG. 4 is circuit diagram of a multiband RF VGA according to an embodiment.

FIG. 4 is circuit diagram of a multiband RF VGA 400 according to an embodiment. Multiband RF VGA 400 comprises a first stage 401 and a second stage 402. First stage 401 is configured to receive an input signal from first amplifier input 403. First stage 401 is further configured to provide a first level of amplification to the input signal and to output an amplified output signal to second stage 402. Second stage 402 provides a second level of amplification to the amplified output signal received from first stage 401 and output an amplified output signal via signal output 470.

Figure 5:
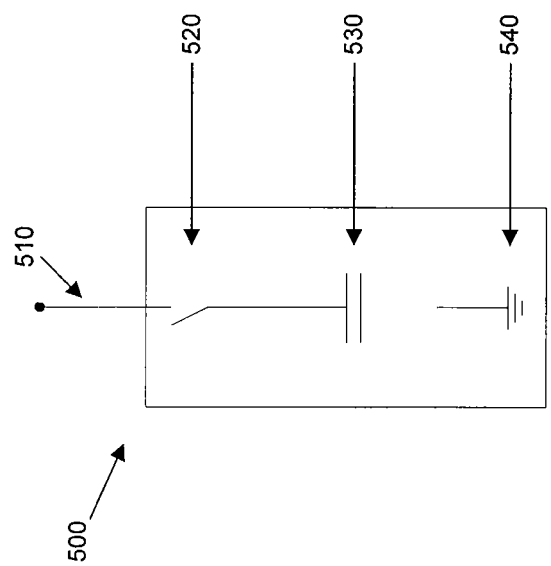
FIG. 5 is a circuit diagram of a switched capacitance unit according to an embodiment.

First stage 401 and second stage 402 include multiple switched capacitance units. Each switched capacitance unit is configurable to add capacitance to the stage of multiband RF VGA 400 in which the switched capacitance unit is included. FIG. 5 is a circuit diagram of a switched capacitance unit 500 according to an embodiment. Switched capacitance unit 500 comprises input 510, switch 520, capacitor 530, and ground 540. Switched capacitance unit 500 connects to first stage 401 or second stage 402 via input 510. When switch 520 is in a closed position, switched capacitance unit 500 provides a connection from input 510 to ground 540 via capacitor 530. Thus, when switch 520 is closed, switched capacitance unit 500 adds additional capacitance to the stage to which the switched capacitance unit connected. Furthermore, when switch 520 is open, the input 510 is disconnected from ground 540 and switched capacitance unit provides no additional capacitance to the stage to which the switched capacitance unit is coupled.

Referring back to FIG. 4, multiband RF VGA 400 includes two switch capacitance units in each of first stage 401 and second state 402. However, in alternative embodiments, the each stage may include more or less switched capacitance units, and the number of switched capacitance units included in each stage may vary from stage to stage.

First stage 401 comprises capacitor 404, first transistor 406, ground 408, second transistor 410, first voltage supply source 412, inductor 414, second voltage supply source 416, first switch capacitance unit 418, second switched capacitance unit 420, and gain selection unit 422. First transistor 406 is coupled to signal input 403 via capacitor 404. Second transistor 410 is coupled to first transistor 406 in a stacked configuration. Second transistor 410 is also coupled to first voltage supply source 412. Second transistor 410 is also coupled to second voltage supply source 416 via inductor 414.

First switched capacitance unit 418 and second switched capacitance unit 420 are configurable to operate in one of at least three modes for amplifying a one of the plurality of input signals. In the first mode, first switch capacitance unit 418 and second switched capacitance unit 420 are configured for amplifying a first signal from the three input signals received by three-to-one multiplexer 120. In the first mode, both first switch capacitance unit 418 and second switched capacitance unit 420 are configured not to add additional capacitance to first stage 401. For example, referring back to switched capacitance unit 500 depicted in FIG. 5, switch 520 configured to an open position in order to disconnect capacitor 530 from first stage 401. Accordingly, in the first mode, switch 520 is configured to an open position for first switched capacitance unit 418 and second switched capacitance unit 420. In the second mode, first switch capacitance unit 418 and second switched capacitance unit 420 are configured for amplifying a second signal from the three input signals received by three-to-one multiplexer 120. In the second mode, first switch capacitance unit 418 is configured to add additional capacitance to first stage 401 and second switched capacitance unit 420 is configured not to add additional capacitance to first stage 401. For example, referring back to switched capacitance unit 500 depicted in FIG. 5, switch 520 is closed in first switched capacitance unit 418 in order to connect first stage 401 to ground 540 via capacitor 530, while switch 520 of switched capacitance unit 420 is configured to an open state such that first stage 401 is disconnected from ground 540. In the third mode, first switch capacitance unit 418 and second switched capacitance unit 420 are configured for amplifying a third signal from the three input signals received by three-to-one multiplexer 120. In the third mode, both first switch capacitance unit 418 and second switched capacitance unit 420 are configured to add additional capacitance to first stage 401. For example, again referring back to switched capacitance unit 500 depicted in FIG. 5, switch 520 is closed in both first switched capacitance unit 418 and second switched capacitance unit 420 in order to connect first stage 401 to ground 540 via capacitor 530.

Figure 6:
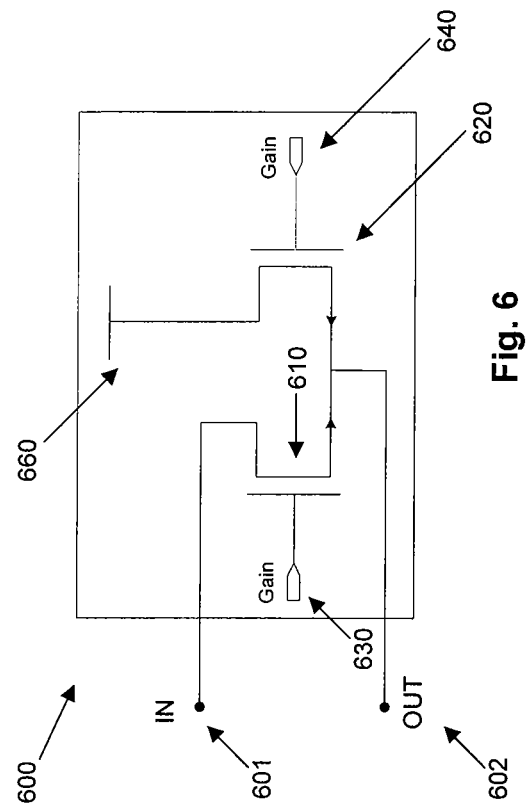
FIG. 6 is a circuit diagram of a gain selection unit according to an embodiment.

Gain selection unit 422 is configured to control, at least in part, the gain of the output signal provided by first stage 401. A circuit diagram of a gain selection unit 600 according to an embodiment is provided in FIG. 6. Gain selection unit 600 comprises first transistor 610 and second transistor 620 arranged in a back-to-back configuration. First transistor 610 is coupled to first gain input 630, to gain selection unit output 602, and gain selection unit input 601. Gain selection unit input 601 receives an input signal from first stage 401 and outputs a signal to first stage 401 via gain selection unit 602. Second transistor 620 is coupled to second gain input 640 and gain selection unit output 602 as well. Second transistor 620 is also coupled to voltage supply 660. By adjusting voltage of first gain input 630 and second gain input 620, the gain of the signal output of first stage 401 can be increased or decreased. Here, second gain input 640 is the inverse of first gain input 630.

Returning back to FIG. 4, second stage 402 comprises capacitor 430, first transistor 432, ground 434, second transistor 436, first voltage supply source 438, inductor 440, second voltage supply source 442, first switch capacitance unit 444, second switched capacitance unit 446, and gain selection unit 448. First transistor 432 is coupled to a signal input via capacitor 430. Second transistor 436 is coupled to first transistor 432 in a stacked configuration. Second transistor 436 is also coupled to first voltage supply source 438. Second transistor 436 is also coupled to second voltage supply source 442 via inductor 440. An amplified signal is output by second stage 402 via signal output 470. Voltage supply sources 412, 416, 438, and 442 are connected to the same voltage source. Also, ground 408 and ground 434 refer to the same ground.

First switched capacitance unit 444 and second switched capacitance unit 446 are configurable to operate in one of at least three modes for amplifying a one of the plurality of input signals. In the first mode, first switch capacitance unit 444 and second switched capacitance unit 446 are configured for amplifying a first signal from the three input signals received by three-to-one multiplexer 120. In the first mode, both first switch capacitance unit 444 and second switched capacitance unit 446 are configured not to add additional capacitance to second stage 402. For example, referring back to switched capacitance unit 500 depicted in FIG. 5, switch 520 configured to an open position in order to disconnect capacitor 530 from second stage 402. Accordingly, in the first mode, switch 520 is configured to an open position for first switched capacitance unit 444 and second switched capacitance unit 446. In the second mode, first switch capacitance unit 444 and second switched capacitance unit 446 are configured for amplifying a second signal from the three input signals received by three-to-one multiplexer 120. In the second mode, first switch capacitance unit 444 is configured to add additional capacitance to second stage 402 and second switched capacitance unit 446 is configured not to add additional capacitance to second stage 402. For example, referring back to switched capacitance unit 500 depicted in FIG. 5, switch 520 is closed in first switched capacitance unit 444 in order to connect second stage 402 to ground 540 via capacitor 530, while switch 520 of switched capacitance unit 446 is configured to an open state such that second stage 402 is disconnected from ground 540. In the third mode, first switch capacitance unit 444 and second switched capacitance unit 446 are configured for amplifying a third signal from the three input signals received by three-to-one multiplexer 120. In the third mode, both first switch capacitance unit 444 and second switched capacitance unit 446 are configured to add additional capacitance to second stage 402. For example, again referring back to switched capacitance unit 500 depicted in FIG. 5, switch 520 is closed in both first switched capacitance unit 444 and second switched capacitance unit 446 in order to connect second stage 402 to ground 540 via capacitor 530.

Gain selection unit 448 is configured to control, at least in part, the gain of the output signal provided by second stage 402. Gain selection unit 448 works similarly to that of gain selection unit 422 to control the gain of the output signal of second stage 402. According to some embodiments, gain selection unit 448 comprises a gain selection unit similar to gain selection unit 600 illustrated in FIG. 6.

Figure 7:
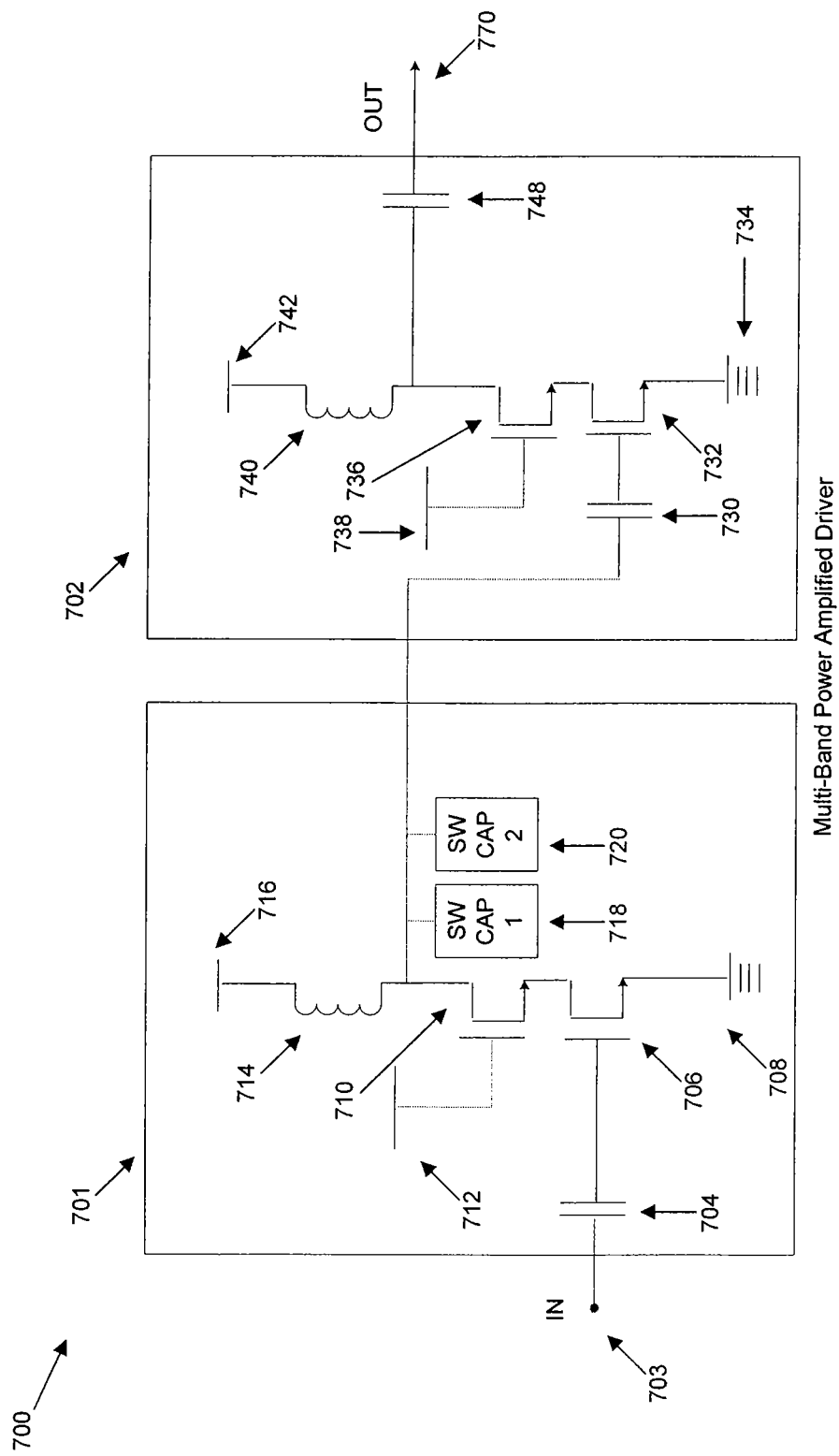
FIG. 7 is a circuit diagram of a multiband power amplifier driver according to an embodiment.

FIG. 7 is a circuit diagram of a multiband power amplifier driver (PAD) 700 according to an embodiment. Multiband PAD 700 comprises a first stage 701 and a second stage 702. First stage 701 is configured to receive an input signal from first amplifier input 703. First stage 701 is further configured to provide a first level of amplification to the input signal and to output an amplified output signal to second stage 702. Second stage 702 provides a second level of amplification to the amplified output signal received from first stage 701 and output an amplified output signal via signal output 770.

First stage 701 includes multiple switched capacitance units. Each switched capacitance unit is configurable to add capacitance to first stage 701 of multiband PAD 700. According to some embodiments, the multiple switched capacitance units of first stage 701 are similar to the switched capacitance units included in stages 401 and 402 of multiband RF VGA 400 described above. FIG. 5 provides a circuit diagram of a switched capacitance unit 500 according to one embodiment. Referring back to FIG. 4, multiband PAD 700 includes two switch capacitance units in first stage 401. However, in alternative embodiments, first stage 701 may include more or less switched capacitance units.

First stage 701 comprises capacitor 704, first transistor 706, ground 708, second transistor 710, first voltage supply source 712, inductor 714, second voltage supply source 716, first switch capacitance unit 718, and second switched capacitance unit 720. First transistor 706 is coupled to signal input 703 via capacitor 704. Second transistor 710 is coupled to first transistor 706 in a stacked configuration. Second transistor 710 is also coupled to first voltage supply source 712. Second transistor 710 is also coupled to second voltage supply source 716 via inductor 714.

First switched capacitance unit 718 and second switched capacitance unit 720 are configurable to operate in one of at least three modes for amplifying a one of the plurality of input signals. In the first mode, first switch capacitance unit 718 and second switched capacitance unit 720 are configured for amplifying a first signal from the three input signals received by three-to-one multiplexer 120. In the first mode, both first switch capacitance unit 718 and second switched capacitance unit 720 are configured not to add additional capacitance to first stage 701. For example, referring back to switched capacitance unit 500 depicted in FIG. 5, switch 520 configured to an open position in order to disconnect capacitor 530 from first stage 701. Accordingly, in the first mode, switch 520 is configured to an open position for first switched capacitance unit 718 and second switched capacitance unit 720. In the second mode, first switch capacitance unit 718 and second switched capacitance unit 720 are configured for amplifying a second signal from the three input signals received by three-to-one multiplexer 120. In the second mode, first switch capacitance unit 718 is configured to add additional capacitance to first stage 701 and second switched capacitance unit 720 is configured not to add additional capacitance to first stage 701. For example, once again referring back to switched capacitance unit 500 depicted in FIG. 5, switch 520 is closed in first switched capacitance unit 718 in order to connect first stage 701 to ground 540 via capacitor 530, while switch 520 of switched capacitance unit 720 is configured to an open state such that first stage 701 is disconnected from ground 540. In the third mode, first switch capacitance unit 718 and second switched capacitance unit 720 are configured for amplifying a third signal from the three input signals received by three-to-one multiplexer 120. In the third mode, both first switch capacitance unit 718 and second switched capacitance unit 720 are configured to add additional capacitance to first stage 701. For example, again referring back to switched capacitance unit 500 depicted in FIG. 5, switch 520 is closed in both first switched capacitance unit 718 and second switched capacitance unit 720 in order to connect first stage 701 to ground 540 via capacitor 530.

Second stage 702 comprises first capacitor 730, first transistor 732, ground 734, second transistor 736, first voltage supply source 7738, inductor 740, and second capacitor 748, and second voltage supply source 742. First transistor 732 is coupled to signal input for stage 702 via capacitor 730. Second transistor 736 is coupled to first transistor 732 in a stacked configuration. Second transistor 736 is also coupled to first voltage supply source 738. Second transistor 736 is also coupled to second voltage supply source 742 via inductor 740. Voltage supply sources 712, 716, 738 and 742 are connected to the same voltage source. Also, ground 708 and ground 734 refer to the same ground.

Second stage 702 does not include switched capacitance units that enable the stage to be adjusted for selecting a one of the plurality of input channel frequencies to be amplified as can be done in first stage 701.

According to an embodiment of the invention, circuits 200, 300, 400, 500, 600 and 700 are implemented using complimentary metal-oxide-semiconductor (CMOS) technology. In other embodiments, the invention may be implemented using other classes of integrated circuits, such as bipolar junction transistors (BJT), BiCMOS (an integration of bipolar junction transistors and CMOS) and/or integrated injection logic (IIL).

While the embodiments described above may make reference to specific hardware components, those skilled in the art will appreciate that different combinations of hardware and/or software components may also be used and that particular operations described as being implemented in hardware might also be implemented in software or vice versa.

Thus, although the invention has been described with respect to specific embodiments, it will be appreciated that the invention is intended to cover all modifications and equivalents within the scope of the following claims.

What is claimed is:

1. An apparatus for amplifying signals comprising:
   a three-to-one multiplexer configured to receive three input signals from an RF frequency source and to output an output signal corresponding to one of the three input signals;
   a multiband RF variable gain amplifier comprising a first amplifier input configured to receive the output signal of the three-to-one multiplexer, wherein the multiband RF variable gain amplifier is configured to provide a first level of amplification to a first input signal received via the first amplifier input and to output an amplified version of the first input signal via a first amplifier output;
   a multiband power amplifier driver (PAD) comprising a second amplifier input configured to receive a signal output by the multiband RF variable gain amplifier, wherein the multiband PAD is configured to provide a second level of amplification to a second input signal received via the second amplifier input and to output an amplified version of the second input signal via a second amplifier output;
   a one-to-three multiplexer configured to receive a signal output by the multiband PAD and to produce three output signals, the three output signals corresponding to each of the three input signals,
   wherein the one-to-three multiplexer comprises multiple switch cores, wherein the one-to-three multiplexer selects one of the three input signals to output as the output signal by configuring each of the multiple switch cores to operate in a first mode or operate in a second mode, and
   wherein each of the multiple switch cores is configurable to operate in a first mode where a switch signal input is A/C-coupled to a switch signal output; and wherein each of the multiple switch cores is configurable to operate in a second mode where switch signal input is disconnected from the switch signal output and a D/C level is set to $V_{DD}$.

2. The apparatus of claim 1, wherein each of the multiple switch cores comprises:
   a switch control input, wherein the switch control input is configurable to a first state associated with the first mode of the one-to-three multiplexer, and wherein the switch control input is configurable to a second state associated with the second mode of the one-to-three multiplexer;
   a first switch transistor, wherein the first switch transistor is coupled the switch control input, wherein the first switch transistor is coupled to the switch signal input via a first switch capacitor, wherein the first switch transistor is coupled to the switch signal output via a second switch capacitor, and wherein when the switch control input is configured to the first state, the first switch transistor provides an A/C-coupled path from the switch signal input to the switch signal output;

a second switch transistor, wherein the second switch transistor is coupled to the first switch capacitor and to ground, and wherein when the switch control input is configured to the first state, the second switch transistor provides a connection from the first switch capacitor to ground;

a third switch transistor, wherein the third switch transistor is coupled to the second switch capacitor and to ground, and wherein when the switch control input is configured to the first state, the third switch transistor provides a connection from the second switch capacitor to ground; and a fourth switch transistor, wherein the fourth switch transistor is coupled to the second switch capacitor and to a switch voltage supply, and wherein when the switch control input is configured to the second state, the fourth switch transistor provides a connection from the second switch capacitor and the switch voltage supply, wherein the second switch capacitor is maintained at $V_{DD}$ and the switch signal input and the switch signal output are no longer A/C-coupled.

3. The apparatus of claim 1, wherein the three-to-one multiplexer comprises multiple switch cores, wherein the three-to-one multiplexer selects one of the three output signals to output as the signal received from the multiband PAD by configuring each of the multiple switch cores.

4. The apparatus of claim 3, wherein each of the multiple switch cores is configurable to a first mode where a switch signal input is A/C-coupled to a switch signal output; and wherein each of the multiple switch cores is configurable to a second mode where switch signal input is disconnected from the switch signal output and a D/C level is set to $V_{DD}$.

5. The apparatus of claim 4, wherein each of the multiple switch cores comprises:

a switch control input, wherein the switch control input is configurable to a first state associated with the first mode of the one-to-three multiplexer, and wherein the switch control input is configurable to a second state associated with the second mode of the one-to-three multiplexer;

a first switch transistor, wherein the first switch transistor is coupled the switch control input, wherein the first switch transistor is coupled to the switch signal input via a first switch capacitor, wherein the first switch transistor is coupled to the switch signal output via a second switch capacitor, and wherein when the switch control input is configured to the first state, the first switch transistor provides an A/C-coupled path from the switch signal input to the switch signal output;

a second switch transistor, wherein the second switch transistor is coupled to the first switch capacitor and to ground, and wherein when the switch control input is configured to the first state, the second switch transistor provides a connection from the first switch capacitor to ground;

a third switch transistor, wherein the third switch transistor is coupled to the second switch capacitor and to ground, and wherein when the switch control input is configured to the first state, the third switch transistor provides a connection from the second switch capacitor to ground;

and a fourth switch transistor, wherein the fourth switch transistor is coupled to the second switch capacitor and to a switch voltage supply, and wherein when the switch control input is configured to the second state, the fourth switch transistor provides a connection from the second switch capacitor and the switch voltage supply, wherein the second switch capacitor is maintained at $V_{DD}$ and the switch signal input and the switch signal output are no longer A/C-coupled.

6. The apparatus of claim 1, wherein the multiband RF-variable gain amplifier further comprises a first stage and a second stage, wherein the first stage is configured to provide a first level of amplification to an input signal received by the first amplifier input, and wherein the second stage is configured to provide a second level of amplification to an amplified signal output by the first stage.

7. The apparatus of claim 6, wherein the first stage and the second stage each include multiple switched capacitance units, wherein each of the multiple switched capacitance units are configurable to add capacitance to the stage with which the switched capacitance unit is associated.

8. The apparatus of claim 7, wherein the first stage and the second stage each include two switched capacitance units, and wherein the two switched capacitance units comprise a first switched capacitance unit and a second switched capacitance unit, and wherein the two switched capacitance units are configurable to operate in at least three modes, wherein each mode is associated with one of the three input signals, the at least three modes comprising:

a first mode for amplifying a first input signal of the three input signals, wherein both the first switched capacitance unit and the second switched capacitance unit are configured not to add additional capacitance to the stage;

a second mode for amplifying a second input signal of the three input signals, wherein the first switched capacitance unit is configured to add additional capacitance to the stage and the second switched capacitance unit is configured to not add additional capacitance to the stage; and a third mode for amplifying a third input signal of the three input signals, wherein both the first switched capacitance unit and the second switched capacitance unit are configured to add additional capacitance to the stage.

9. The apparatus of claim 8, wherein the first stage further comprises: a first first stage transistor, wherein the first first stage transistor is coupled to the first stage input through a first stage capacitor;

a second first stage transistor, wherein the second first stage transistor is coupled to the first first stage transistor;

a first stage gain selection unit, wherein the first stage gain selection unit is configured to receive a gain signal and control a level of gain associated with amplification provided by the first stage; and a first stage output, wherein the first stage output is configured to output an amplified signal from the first stage; and wherein the second stage further comprises:

a first second stage transistor, wherein the first second stage transistor is coupled to the first stage input through a second stage capacitor;

a second second stage transistor, wherein the second second stage transistor is coupled to the first second stage transistor; and a second stage gain selection unit, wherein the second stage gain selection unit is configured to receive a gain signal and control a level of gain associated with amplification provided by the second stage.

10. The apparatus of claim 9, wherein the first stage is coupled through a first stage inductor to a voltage supply source and the first stage is coupled to ground by the first first stage transistor, and the second stage is coupled through a second stage inductor to the voltage supply source and the second stage is coupled to ground by the first second stage transistor.

11. The apparatus of claim 9, wherein the first first stage transistor and the second first stage transistor are arranged in a stacked configuration.

12. The apparatus of claim 9, wherein the first first stage switched capacitance unit, the second first stage switched capacitance unit, the first second stage switched capacitance unit, and the second second stage switched capacitance unit comprise a switched capacitance unit comprising:
at least one capacitor coupled to a switch to provide controllably added capacitance, the switched capacitance unit having at least a first position associated with operation over a first frequency band and at least a second position associated with operation over a second frequency band.

13. The apparatus of claim 9, wherein the first stage gain selection unit, and the second stage gain selection unit each comprise a gain selection unit including:
a first gain selection transistor and a second gain selection transistor arranged in a back-to-back configuration.

14. The apparatus of claim 1, wherein the multiband power amplifier driver (PAD) comprises a first stage and a second stage, wherein the first stage is configured to provide a first level of amplification to an input signal received by the first amplifier input, and wherein the second stage is configured to provide a second level of amplification to an amplified signal output by the first stage.

15. The apparatus of claim 14, wherein the first stage and the second stage each include multiple switched capacitance units, wherein each of the multiple switched capacitance units are associated with a stage of the multiband RF-variable gain amplifier to which, and wherein each of the multiple switched capacitance units are configurable to add capacitance to the stage with which the multiple switched capacitance unit is associated.

16. The apparatus of claim 15, wherein the first stage and the second stage each include two switched capacitance units, and wherein the two switched capacitance units comprise a first switched capacitance unit and a second switched capacitance unit, and wherein the two switched capacitance units are configurable to operate in at least three modes, wherein each mode is associated with one of the three input signals, the at least three modes comprising:
a first mode for amplifying a first input signal of the three input signals, wherein both the first switched capacitance unit and the second switched capacitance unit are configured not to add additional capacitance to the stage;
a second mode for amplifying a second input signal of the three input signals, wherein the first switched capacitance unit is configured to add additional capacitance to the stage and the second switched capacitance unit is configured to not add additional capacitance to the stage; and
a third mode for amplifying a third input signal of the three input signals, wherein both the first switched capacitance unit and the second switched capacitance unit are configured to add additional capacitance to the stage.

17. The apparatus of claim 16, wherein the first stage further comprises:

a first first stage transistor, wherein the first first stage transistor is coupled to the first stage input through a first stage capacitor; and
a second first stage transistor, wherein the second first stage transistor is coupled to the first first stage transistor; and
a first stage gain selection unit, wherein the first stage gain selection unit is configured to receive a gain signal and control a level of gain associated with amplification provided by the first stage; and
wherein the second stage further comprises:
a second stage capacitor;
a first second stage transistor, wherein the first second stage transistor is coupled to a second stage input;
a second second stage transistor, wherein the second second stage transistor is coupled to the first second stage transistor, and wherein the second stage transistor is coupled to a second stage output through the second stage capacitor.

18. A method for amplifying signals comprising:
operating a three-to-one multiplexer configured to receive three input signals from an RF frequency source and to output an output signal corresponding to one of the three input signals;
operating a multiband RF variable gain amplifier comprising a first amplifier input configured to receive the output signal of the three-to-one multiplexer, wherein the multiband RF variable gain amplifier is configured to provide a first level of amplification to a first input signal received via the first amplifier input and to output an amplified version of the first input signal via a first amplifier output;
operating a multiband power amplifier driver (PAD) comprising a second amplifier input configured to receive a signal output by the multiband RF variable gain amplifier, wherein the multiband PAD is configured to provide a second level of amplification to a second input signal received via the second amplifier input and to output an amplified version of the second input signal via a second amplifier output;
operating a one-to-three multiplexer configured to receive a signal output by the multiband PAD and to produce three output signals, the three output signals corresponding to each of the three input signals,.
wherein the one-to-three multiplexer comprises multiple switch cores, wherein the one-to-three multiplexer selects one of the three input signals to output as the output signal by configuring each of the multiple switch cores, and
wherein each of the multiple switch cores is configurable to a first mode where a switch signal input is A/C-coupled to a switch signal output; and wherein each of the multiple switch cores is configurable to a second mode where switch signal input is disconnected from the switch signal output and a D/C level is set to $V_{DD}$.

19. The method of claim 18, wherein each of the multiple switch cores comprises:
a switch control input, wherein the switch control input is configurable to a first state associated with the first mode of the one-to-three multiplexer, and wherein the switch control input is configurable to a second state associated with the second mode of the one-to-three multiplexer;
a first switch transistor, wherein the first switch transistor is coupled the switch control input, wherein the first switch transistor is coupled to the switch signal input via a first switch capacitor, wherein the first switch transistor is coupled to the switch signal output via a second switch capacitor, and wherein when the switch control input is configured to the first state, the first switch transistor provides an A/C-coupled path from the switch signal input to the switch signal output;

a second switch transistor, wherein the second switch transistor is coupled to the first switch capacitor and to ground, and wherein when the switch control input is configured to the first state, the second switch transistor provides a connection from the first switch capacitor to ground;

a third switch transistor, wherein the third switch transistor is coupled to the second switch capacitor and to ground, and wherein when the switch control input is configured to the first state, the third switch transistor provides a connection from the second switch capacitor to ground; and a fourth switch transistor, wherein the fourth switch transistor is coupled to the second switch capacitor and to a switch voltage supply, and wherein when the switch control input is configured to the second state, the fourth switch transistor provides a connection from the second switch capacitor and the switch voltage supply, wherein the second switch capacitor is maintained at $V_{DD}$ and the switch signal input and the switch signal output are no longer A/C-coupled.

20. The method of claim 18, wherein the three-to-one multiplexer comprises multiple switch cores, wherein the three-to-one multiplexer selects one of the three output signals to output as the signal received from the multiband PAD by configuring each of the multiple switch cores.

21. The method of claim 20, wherein each of the multiple switch cores is configurable to a first mode where a switch signal input is A/C-coupled to a switch signal output; and
wherein each of the multiple switch cores is configurable to a second mode where switch signal input is disconnected from the switch signal output and a D/C level is set to $V_{DD}$.

22. The method of claim 21, wherein each of the multiple switch cores comprises:
a switch control input, wherein the switch control input is configurable to a first state associated with the first mode of the one-to-three multiplexer, and wherein the switch control input is configurable to a second state associated with the second mode of the one-to-three multiplexer;
a first switch transistor, wherein the first switch transistor is coupled the switch control input, wherein the first switch transistor is coupled to the switch signal input via a first switch capacitor, wherein the first switch transistor is coupled to the switch signal output via a second switch capacitor, and wherein when the switch control input is configured to the first state, the first switch transistor provides an A/C-coupled path from the switch signal input to the switch signal output;
a second switch transistor, wherein the second switch transistor is coupled to the first switch capacitor and to ground, and wherein when the switch control input is configured to the first state, the second switch transistor provides a connection from the first switch capacitor to ground;
a third switch transistor, wherein the third switch transistor is coupled to the second switch capacitor and to ground, and wherein when the switch control input is configured to the first state, the third switch transistor provides a connection from the second switch capacitor to ground; and a fourth switch transistor, wherein the fourth switch transistor is coupled to the second switch capacitor and to a switch voltage supply, and wherein when the switch control input is configured to the second state, the fourth switch transistor provides a connection from the second switch capacitor and the switch voltage supply, wherein the second switch capacitor is maintained at $V_{DD}$ and the switch signal input and the switch signal output are no longer A/C-coupled.

23. The method of claim 18, wherein the multiband RF-variable gain amplifier further comprises a first stage and a second stage, wherein the first stage is configured to provide a first level of amplification to an input signal received by the first amplifier input, and wherein the second stage is configured to provide a second level of amplification to an amplified signal output by the first stage.

24. The method of claim 23, wherein the first stage and the second stage each include multiple switched capacitance units, wherein each of the multiple switched capacitance units are associated with a stage of the multiband RF-variable gain amplifier to which, and wherein each of the multiple switched capacitance units are configurable to add capacitance to the stage with which the multiple switched capacitance unit is associated.

25. The method of claim 24, wherein the first stage and the second stage each include multiple switched capacitance units, wherein each of the multiple switched capacitance units are associated with a stage of the multiband RF-variable gain amplifier to which, and wherein each of the multiple switched capacitance units are configurable to add capacitance to the stage with which the multiple switched capacitance unit is associated.

26. The method of claim 25, wherein the first stage and the second stage each include two switched capacitance units, and wherein the two switched capacitance units comprise a first switched capacitance unit and a second switched capacitance unit, and wherein the two switched capacitance units are configurable to operate in at least three modes, wherein each mode is associated with one of the three input signals, the at least three modes comprising:
a first mode for amplifying a first input signal of the three input signals, wherein both the first switched capacitance unit and the second switched capacitance unit are configured not to add additional capacitance to the stage;
a second mode for amplifying a second input signal of the three input signals, wherein the first switched capacitance unit is configured to add additional capacitance to the stage and the second switched capacitance unit is configured to not add additional capacitance to the stage; and
a third mode for amplifying a third input signal of the three input signals, wherein both the first switched capacitance unit and the second switched capacitance unit are configured to add additional capacitance to the stage.

27. The method of claim 26, wherein the first stage further comprises:
a first first stage transistor, wherein the first first stage transistor is coupled to the first stage input through a first stage capacitor;
a second first stage transistor, wherein the second first stage transistor is coupled to the first first stage transistor;
a first stage gain selection unit, wherein the first stage gain selection unit is configured to receive a gain signal and control a level of gain associated with amplification provided by the first stage; and
a first stage output, wherein the first stage output is configured to output an amplified signal from the first stage; and
wherein the second stage further comprises:
a first second stage transistor, wherein the first second stage transistor is coupled to the first stage input through a second stage capacitor;
a second second stage transistor, wherein the second second stage transistor is coupled to the first second stage transistor; and
a second stage gain selection unit, wherein the second stage gain selection unit is configured to receive a gain signal and control a level of gain associated with amplification provided by the second stage.

28. The method of claim 27, wherein the first stage is coupled through a first stage inductor to a voltage supply source and the first stage is coupled to ground by the first first stage transistor, and the second stage is coupled through a second stage inductor to the voltage supply source and the second stage is coupled to ground by the first second stage transistor.

29. The method of claim 27, wherein the first first stage transistor and the second first stage transistor are arranged in a stacked configuration.

30. The method of claim 27, wherein the first first stage switched capacitance unit, the second first stage switched capacitance unit, the first second stage switched capacitance unit, and the second second stage switched capacitance unit comprise a switched capacitance unit comprising:
at least one capacitor coupled to a switch to provide controllably added capacitance, the switched capacitance unit having at least a first position associated with operation over a first frequency band and at least a second position associated with operation over a second frequency band.

31. The method of claim 27, wherein the first stage gain selection unit, and the second stage gain selection unit each comprise a gain selection unit comprising:
a first gain selection transistor and a second gain selection transistor arranged in a back-to-back configuration.

32. The method of claim 18, wherein the multiband power amplifier driver (PAD) comprises a first stage and a second stage, wherein the first stage is configured to provide a first level of amplification to an input signal received by the first amplifier input, and wherein the second stage is configured to provide a second level of amplification to an amplified signal output by the first stage.

33. The method of claim 32, wherein the first stage and the second stage each include multiple switched capacitance units, wherein each of the multiple switched capacitance units are associated with a stage of the multiband RF-variable gain amplifier to which, and wherein each of the multiple switched capacitance units are configurable to add capacitance to the stage with which the multiple switched capacitance unit is associated.

34. The method of claim 33, wherein the first stage and the second stage each include two switched capacitance units, and wherein the two switched capacitance units comprise a first switched capacitance unit and a second switched capacitance unit, and wherein the two switched capacitance units are configurable to operate in at least three modes, wherein each mode is associated with one of the three input signals, the at least three modes comprising:
a first mode for amplifying a first input signal of the three input signals, wherein both the first switched capacitance unit and the second switched capacitance unit are configured not to add additional capacitance to the stage;
a second mode for amplifying a second input signal of the three input signals, wherein the first switched capacitance unit is configured to add additional capacitance to the stage and the second switched capacitance unit is configured to not add additional capacitance to the stage; and
a third mode for amplifying a third input signal of the three input signals, wherein both the first switched capacitance unit and the second switched capacitance unit are configured to add additional capacitance to the stage.

35. The method of claim 34, wherein the first stage further comprises:
a first first stage transistor, wherein the first first stage transistor is coupled to the first stage input through a first stage capacitor; and
a second first stage transistor, wherein the second first stage transistor is coupled to the first first stage transistor; and
a first stage gain selection unit, wherein the first stage gain selection unit is configured to receive a gain signal and control a level of gain associated with amplification provided by the first stage; and
wherein the second stage further comprises:
a second stage capacitor;
a first second stage transistor, wherein the first second stage transistor is coupled to a second stage input;
a second second stage transistor, wherein the second second stage transistor is coupled to the first second stage transistor, and wherein the second stage transistor is coupled to a second stage output through the second stage capacitor.

\* \* \* \* \*